United States Patent
Kaneko

(10) Patent No.: US 12,543,453 B2
(45) Date of Patent: Feb. 3, 2026

(54) DISPLAY DEVICE AND METHOD FOR MANUFACTURING SAME

(71) Applicant: SHARP KABUSHIKI KAISHA, Sakai (JP)

(72) Inventor: Toshihiro Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 659 days.

(21) Appl. No.: 17/913,608

(22) PCT Filed: Mar. 30, 2020

(86) PCT No.: PCT/JP2020/014630
§ 371 (c)(1),
(2) Date: Sep. 22, 2022

(87) PCT Pub. No.: WO2021/199189
PCT Pub. Date: Oct. 7, 2021

(65) Prior Publication Data
US 2023/0104604 A1 Apr. 6, 2023

(51) Int. Cl.
*H10K 59/124* (2023.01)
*H10K 50/115* (2023.01)
(Continued)

(52) U.S. Cl.
CPC ......... *H10K 59/124* (2023.02); *H10K 50/115* (2023.02); *H10K 59/122* (2023.02); *H10K 59/123* (2023.02); *H10K 59/1201* (2023.02)

(58) Field of Classification Search
CPC .. G09F 9/00; G09F 9/30; H05B 33/02; H05B 33/10; H05B 33/14; H05B 33/22;
(Continued)

(56) References Cited

U.S. PATENT DOCUMENTS

2002/0057055 A1* 5/2002 Yamazaki .............. H10K 50/17
313/506
2004/0113548 A1 6/2004 Yamazaki et al.
(Continued)

FOREIGN PATENT DOCUMENTS

| JP | 2002203682 A | 7/2002 |
| JP | 2008288171 A | 11/2008 |
| JP | 2016085913 A | 5/2016 |

*Primary Examiner* — Shaun M Campbell
(74) *Attorney, Agent, or Firm* — ScienBiziP, P.C.

(57) ABSTRACT

A display device includes a plurality of sub-pixels, a support body, a thin-film-transistor layer, a light-emitting-element layer, and a sealing layer. The thin-film-transistor layer includes a plurality of thin-film transistors and a planarization film. The light-emitting-element layer includes a plurality of light-emitting elements. Each of the plurality of light-emitting elements includes a lower electrode, a functional layer, and an upper electrode. The lower electrode is a sub-pixel electrode shaped into an island and provided for each of the sup-pixel electrodes. The upper electrode is a common electrode formed in common among all the plurality of sub-pixels. The planarization film includes a trench shaped into a frame and provided for each of the sub-pixels. The trench defines a light-emitting region of the light-emitting element for each of the sub-pixels.

11 Claims, 8 Drawing Sheets

(51) Int. Cl.
*H10K 59/12* (2023.01)
*H10K 59/122* (2023.01)
*H10K 59/123* (2023.01)

(58) Field of Classification Search
CPC .............. H10K 50/115; H10K 50/844; H10K 59/1201; H10K 59/122; H10K 59/123; H10K 59/124; H10K 59/35; H10K 71/00
See application file for complete search history.

(56) References Cited

U.S. PATENT DOCUMENTS

| | | |
|---|---|---|
| 2005/0199874 A1 | 9/2005 | Yamazaki et al. |
| 2006/0141645 A1 | 6/2006 | Yamazaki et al. |
| 2011/0207248 A1 | 8/2011 | Yamazaki et al. |
| 2016/0118449 A1* | 4/2016 | Sato .................. H10K 50/805 257/89 |
| 2017/0256754 A1* | 9/2017 | Defranco ............ H10K 50/805 |
| 2018/0184501 A1* | 6/2018 | Park ..................... H05B 33/26 |
| 2019/0288044 A1* | 9/2019 | Hou .................... H10K 50/824 |
| 2020/0335575 A1* | 10/2020 | Dong ..................... H01L 24/32 |

\* cited by examiner

DISPLAY DEVICE AND METHOD FOR MANUFACTURING SAME

TECHNICAL FIELD

The present disclosure relates to a display device and a method for manufacturing the display device.

BACKGROUND ART

A light-emitting display device includes: a lower electrode; an upper electrode; and a functional layer provided between the lower electrode and the upper electrode and including a light-emitting layer.

In such a display device, in order to prevent a short circuit between the lower electrode and the upper electrode, an edge of the lower electrode is covered with, for example, an insulating layer referred to as a bank or an edge cover formed in a lattice structure. In addition, an interior of an opening portion in the insulating layer is coated with a light-emitting material (see, for example, Patent Document 1).

CITATION LIST

Patent Literature

[Patent Document 1] Japanese Unexamined Patent Publication Application No. 2008-288171

SUMMARY

Technical Problem

However, the known display device has a light-emitting region provided only in the opening portion of the above insulating layer, resulting in a low aperture ratio (i.e. a small light-emitting area in the light-emitting region). In addition, the known display device actually emits light almost only from an edge of the opening portion of the above insulating layer because of a so-called coffee ring effect. Hence, a problem of the known display device is that the display screen is very dark.

The present disclosure is conceived in view of the above problem, and intended to provide a display device capable of emitting substantially uniform light in the light-emitting region. The display device is higher in aperture ratio and luminance than a known display device.

Solution to Problem

In order to solve the above problem, a display device according to an aspect of the present disclosure includes a plurality of sub-pixels. The display device includes: a support body; a thin-film-transistor layer; a light-emitting-element layer; and a sealing layer sealing the light-emitting element, all of which are provided in a stated order, wherein the thin-film-transistor layer includes: a plurality of thin-film transistors; and a planarization film covering the plurality of thin-film transistors, the light-emitting-element layer includes a plurality of light-emitting element configured to emit lights in different colors, each of the plurality of light-emitting elements includes: a lower electrode; a functional layer including a light-emitting layer; and an upper electrode, all of which are provided in a stated order from toward the planarization film, the lower electrode is a sub-pixel electrode shaped into an island and provided for each of the sup-pixel electrodes, the upper electrode is a common electrode formed in common among all the plurality of sub-pixels, and the planarization film includes a trench shaped into a frame and provided for each of the sub-pixels, the trench defining a light-emitting region of the light-emitting element for each of the sub-pixels.

In order to solve the above problem, a method for manufacturing a display device according to an aspect of the present disclosure is a method for manufacturing the display device according to an aspect of the present disclosure. The method includes: a step of forming the thin-film-transistor layer including: the plurality of thin-film transistors; and the planarization film covering the plurality of thin-film transistors; a step of forming the trench in the planarization film, for each of the sub-pixels; and a step of forming the plurality of light-emitting elements, wherein the step of forming the plurality of light-emitting elements includes a step of forming the lower electrode, and, in the step of forming the lower electrode, the lower electrode is formed so that an edge portion of the light-emitting element for each of the sub-pixels is positioned inside the trench for each of the sub-pixels.

Advantageous Effects of Disclosure

An aspect of the present disclosure can provide a display device capable of preventing a short circuit between a lower electrode and an upper electrode, and emitting substantially uniform light in the light-emitting region. The display device is higher in aperture ratio and luminance than a known display device.

FIRST EMBODIMENT

An embodiment of the present disclosure is described below, with reference to FIGS. 1 to 10.
(Schematic Configuration of Display Device)

Figure 5:
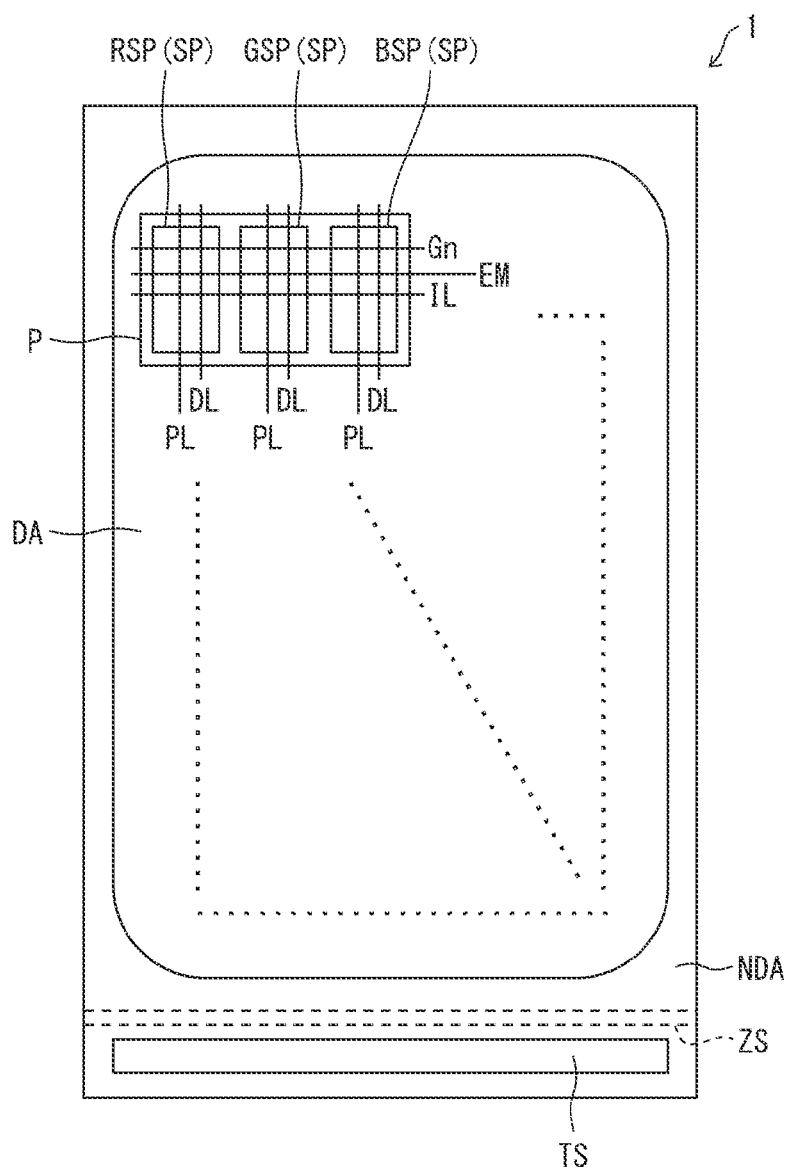
FIG. 5 is a plan view of an exemplary schematic configuration of the display device according to the first embodiment.

FIG. 5 is a plan view of an exemplary schematic configuration of a display device 1 according to this embodiment.

As illustrated in FIG. 5, the display device 1 includes a display region DA including a plurality of sub-pixels SP, and a frame region NDA provided around, and surrounding, the display region DA.

The frame region NDA is a non-display region, and includes a fold portion ZS provided between a terminal unit TS and the display region DA. The terminal unit TS is provided with a not-shown electronic circuit board including, for example, an integrated circuit (IC) chip and a flexible printed circuit (FPC).

The display unit DA includes: a plurality of scan signal lines Gn; a plurality of light-emission control lines EM; and a plurality of initialization potential lines IL, all of which are provided to extend in a row direction. Moreover, the display unit DA includes: a plurality of power source lines PL; and a plurality of data signal lines DL, all of which are provided to extend in a column direction. Note that the plurality of power source lines PL may be provided in a matrix to extend in the row and column directions.

The plurality of sub-pixels SP are provided in a matrix to correspond to the intersections of the scan signal lines Gn and the data signal lines DL.

The display device 1 includes such sub-pixels SP as, for example, red (R) sub-pixels RSP, green (G) sub-pixels GSP, and blue (B) sub-pixels BSP. Note that, in this embodiment, if these sub-pixels RSP, GSP, and BSP do not have to be distinguished in particular from one another, these sub-pixels RSP, GSP, and BSP are simply and collectively referred to as "sub-pixels SP". A pixel P includes three of the sub-pixels SP in respective colors. Each of the sub-pixels SP presents a different color out of the three colors of R, G, and B. Hence, the display region DA includes a matrix of pixels P each including the three sub-pixels SP in the respective colors. Each of the sub-pixels SP presents a different color out of the three colors of R, G, and B.

These sub-pixels RSP, GSP, and BSP are, for example, repetitively arranged in this order in a direction along the scan signal lines Gn. Moreover, these sub-pixels RSP, GSP, and BSP are arranged by the colors in a direction along the data signal lines DL.

From now on, the display device 1 includes the RGB sub-pixels SP (i.e. the sub-pixels RSP, GSP, and BSP) arranged in the above manner. Note that the above example is one example, and the display device 1 may include sub-pixels SP other than the RGB sub-pixels. Moreover, the arrangement of the sub-pixels SP shall not be limited to the above arrangement.

Figure 1:
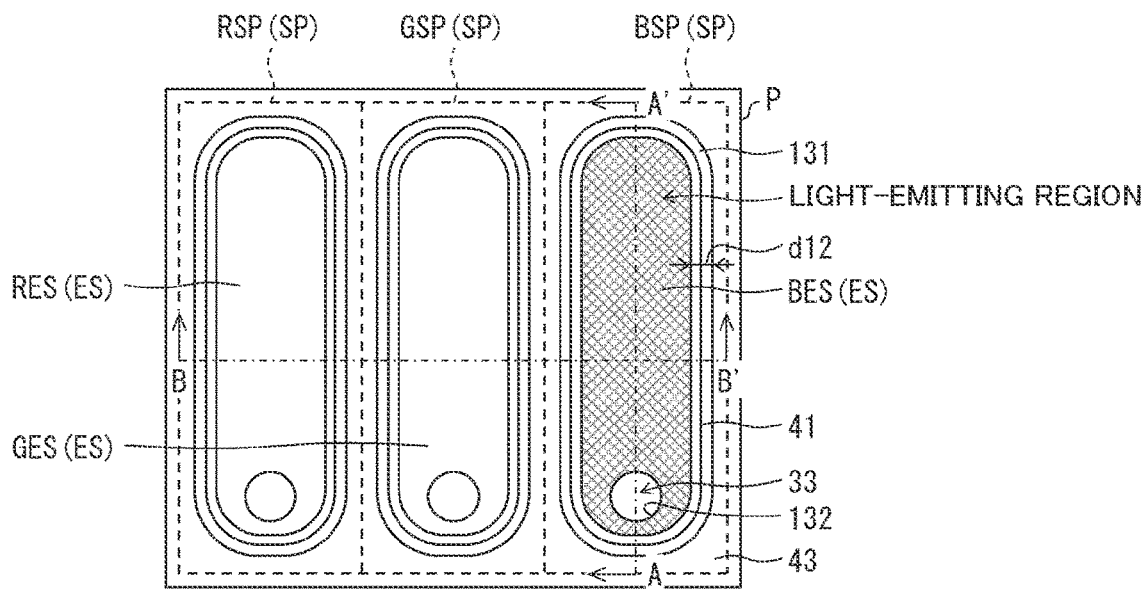
FIG. 1 is a plan view of an exemplary schematic configuration of a pixel in a display device according to a first embodiment.
Figure 2:
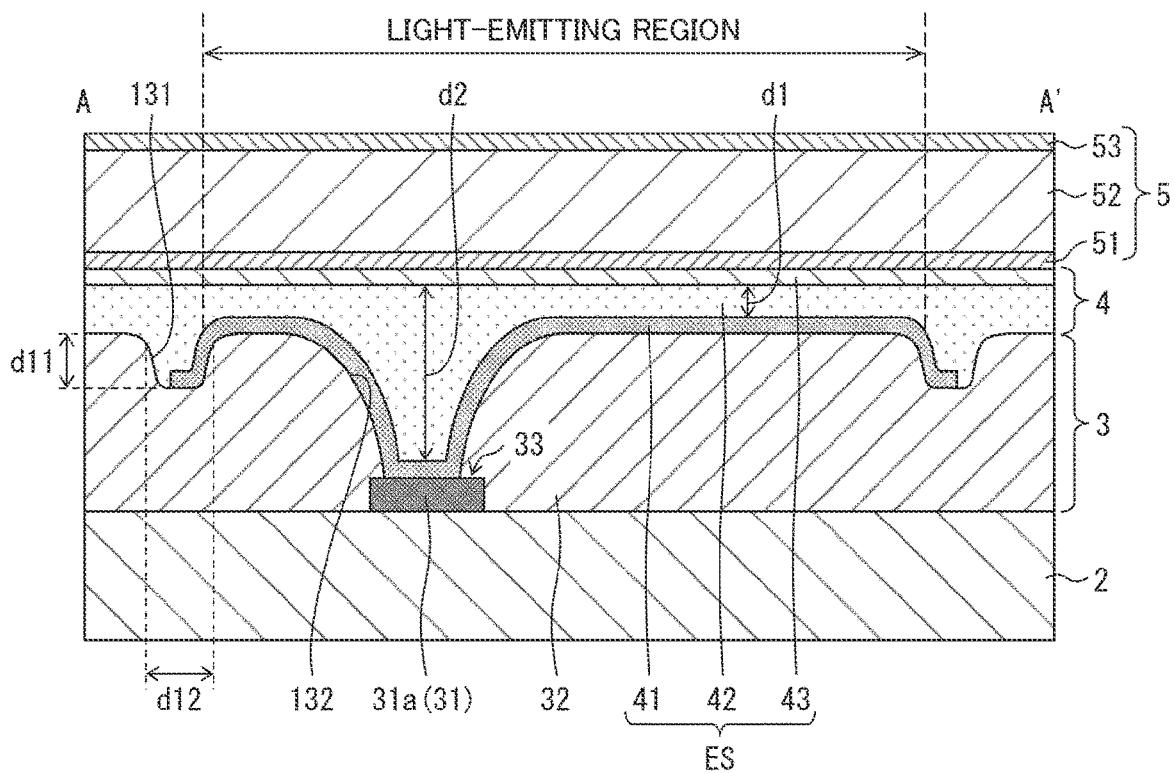
FIG. 2 is a cross-sectional view of a sub-pixel, viewed along arrows A-A' in FIG. 1.

FIG. 1 is a plan view (a perspective view) of an exemplary schematic configuration of a pixel P in the display device 1 according to the first embodiment. FIG. 2 is a cross-sectional view of a sub-pixel SP, viewed along arrows A-A' in FIG. 1.

The display device 1 is a light-emitting display device. As illustrated in FIG. 1, each sub-pixel SP includes a self-luminous light-emitting element ES.

A red sub-pixel RSP is provided with, as the light-emitting element ES, a light-emitting element RES (a red light-emitting element) that emits a red light. A green sub-pixel GSP is provided with, as the light-emitting element ES, a light-emitting element GES (a green light-emitting element) that emits a green light. A blue sub-pixel BSP is provided with, as the light-emitting element ES, a light-emitting element BES (a blue light-emitting element) that emits a blue light. Hence, the display region DA is provided with a plurality of the light-emitting elements ES that emit lights in different colors. Note that, in this embodiment, if these light-emitting elements RES, GES, and BES do not have to be distinguished in particular from one another, these light-emitting elements RES, GES, and BES are simply and collectively referred to as "light-emitting elements ES". Moreover, the layers of the light-emitting elements ES are also referred collectively unless otherwise distinguished from one another between the light-emitting elements RES, GES, and BES.

As illustrated in FIG. 2, the display device 1 includes a substrate 2, a thin-film-transistor layer 3, a light-emitting-element layer 4, and a sealing layer 5, all of which are provided in the stated order.

The substrate 2 is a support body to support each of the layers from the thin-film-transistor layer 3 to the sealing layer 5. The substrate 2 may be either: an inorganic substrate made of such an inorganic material as glass, quartz, or ceramic; or a flexible substrate whose principal component is such a resin as polyethylene terephthalate, polycarbazole, or polyimide. For example, the substrate 2 may be formed of a double-layer polyimide film, and an inorganic film sandwiched between the layers. Moreover, the substrate 2 may be a metal substrate made of such a metal as aluminum or iron. The metal substrate may have a surface coated with an insulating film made of, for example, silicon oxide ($SiO_x$), silicon nitride ($SiN_x$), or an organic insulating material. Furthermore, the substrate 2 may be made of a metal substrate containing, for example, Al. The metal substrate may have a surface insulated by such a technique as anodizing.

Note that, if the display device 1 is a top-emission display device that emits light from above the light-emitting element ES (i.e. from a face of the light-emitting element ES away from the substrate 2), the substrate 2 to be used shall not be limited to a particular substrate. However, if the display device 1 is a bottom-emission display device that emits light from below the light-emitting element ES (i.e. from a back face of the substrate 2), a transparent substrate or a translucent light-transparent substrate is used as the substrate 2.

The thin-film-transistor layer 3 includes a sub-pixel circuit formed to control each light-emitting element ES in the light-emitting-element layer 4. The sub-pixel circuit is included in in the display region DA. Each sub-pixel circuit is provided for a corresponding one of the sub-pixels SP. In the thin-film-transistor layer 3, the sub-pixel circuit and a wire connecting to the sub-pixel circuit are formed.

The thin-film-transistor layer 3 includes not-shown constituent features such as a semiconductor layer, a first inorganic insulating film, a first wire, a second inorganic insulating film, a second wire, a third inorganic insulating film, and a third wire, and a planarization film 32, all of which are provided in the stated order from toward the substrate 2.

The semiconductor layer is provided on the substrate 2 and shaped into an island. Note that a not-shown barrier layer (a base coat layer) may be provided below the semiconductor layer (specifically between the substrate 2 and the thin-transistor layer 3) to block such foreign objects as water and oxygen. The barrier layer can be an inorganic insulating film made of, for example, silicon oxide or silicon nitride.

The first inorganic insulating film is a gate insulating film provided over the entire display region DA to cover the semiconductor layer. The first wire is a first metal layer formed on the first inorganic insulating film. The first wire includes the scan signal lines Gn and the light-emission control lines EM. The second inorganic insulating film is provided on the first inorganic insulating film to cover the first wire. The second wire is a second metal layer formed on the second inorganic insulating film. The second wire includes the initialization potential lines IL. The third inorganic insulating film is provided on the second inorganic insulating film to cover the second wire. The third wire is a third metal layer formed on the third inorganic insulating film. The third wire includes the data signal lines DL and the power source lines PL. The planarization film 32 is provided on the third inorganic insulating film to cover the third wire.

The semiconductor layer is formed of, for example, low-temperature polysilicon (LTPS). Note that, as the semiconductor layer, a region of the transistor other than the channel region may be treated to be conductive.

Each of the first metal layer, the second metal layer, the third metal layer, and the fourth metal layer is a monolayer metal film made of at least one of such a metal as, for example, aluminum, tungsten, molybdenum, tantalum, chromium, titanium, or copper. Alternatively, each metal layer is a multilayer metal film formed of these metals.

Each of the first inorganic insulating film, the second inorganic insulating film, and the third inorganic insulating film can be, for example, an inorganic insulating film such as a silicon oxide film or a silicon nitride film formed by chemical vapor deposition (CVD). The planarization film 32 can be made of, for example, an applicable organic material such as polyimide or acrylic resin.

The sub-pixel circuit unit controls, with a gradient voltage, a current to the light-emitting element ES. The sub-pixel circuit unit may have any given configuration as long as the sub-pixel circuit unit can individually drive the light-emitting element ES in the respective sub-pixel SP.

The sub-pixel circuit unit may be any given combination of a plurality of elements including, for example, a drive transistor, a write-control transistor, a power-source supply control transistor, a light-emission control transistor, a threshold voltage compensation transistor, an initialization transistor, and a capacitive element. Moreover, these elements may be connected in any given manner to the scan signal lines Gn, the data signal lines DL, the initialization potential lines IL, the power source lines PL, and the light-emission control lines EM. Hence, the elements can carry out desired functions.

The sub-pixel circuit unit includes a plurality of thin-film transistors 31 of the above transistors such as the drive transistor, the write-control transistor, the power-source supply control transistor, the light-emission control transistor, the threshold voltage compensation transistor, and the initialization transistor. In the thin-film-transistor layer 3, a region corresponding to the display region DA includes a plurality of the thin-film transistors 31. Each of these thin-film transistors 31 includes the semiconductor film, the first inorganic insulating film, a gate electrode in the same layer as the first wire, the second inorganic insulating film, the third insulating film, and source and drain electrodes in the same layer as the third wire. The planarization film 32 covers the plurality of thin-film transistors 31 to planarize the surfaces of the plurality of the thin-film transistors 31.

Of these plurality of thin-film transistors 31, a drive transistor to control a current of the light-emitting element ES is connected to a lower electrode 41 of the light-emitting element ES through a thin-film transistor 31a; namely, a light-emission control transistor, illustrated in FIG. 2. The thin-film transistor 31a has a gate terminal connected to a light-emission control line EM of the respective stage (the respective sub-pixel SP). The light-emission control line EM controls the timing of ON and OFF of the light emitted from the light-emitting element ES on the respective stage.

The planarization film 32 includes, for each of the sub-pixels SP, a trench 131 and a contact hole portion 132.

The thin-film transistor 31a has a source electrode electrically connected to the lower electrode 41 of the light-emitting element ES through the contact hole portion 132 formed in the planarization film 32. Hence, the source electrode of the thin-film transistor 31a and the lower electrode 41 of the light-emitting element ES form a thin-film-transistor-light-emitting-element contact portion 33 inside the contact hole portion 132, as illustrated in FIGS. 1 and 2. Note that the lower electrode 41 of the light-emitting element ES is formed on the planarization film 32.

The trench 131, as illustrated in FIG. 1, is shaped into a frame to surround a light-emitting element ES for each of the sub-pixels SP. Hence, the thin-film-transistor-light-emitting-element contact portion 33 is provided behind the trench 131 shaped into a frame for each sub-pixel SP (i.e. provided in a region surrounded with the trench 131). Note that the trench 131 will be described later in detail.

The light-emitting-element layer 4 includes the plurality of light-emitting elements ES (specifically, the light-emitting elements RES, GES, and BES). The light-emitting-element layer 4 includes the lower electrode 41, a functional layer 42, and an upper electrode 43 stacked on top of another in the stated order from toward the thin-film-transistor layer 3.

The light-emitting elements ES are self-luminous light-emitting elements each including the lower electrode 41, the functional layer 42 (an active layer) including at least a light-emitting layer, and the upper electrode 43. As described before, the light-emitting elements ES are each formed for a corresponding one of the sub-pixels SP.

One of the lower electrode 41 or the upper electrode 43 is an anode, and the other one is a cathode. The lower electrode 41 is a sub-pixel electrode patterned in the shape of an island and formed for each sub-pixel SP. The upper electrode 43 is a common electrode formed in common among all the sub-pixels SP.

The functional layer 42 is a layer between the lower electrode 41 and the upper electrode 43 in the light-emitting element ES. The functional layer 42 includes at least a light-emitting layer.

The light-emitting element ES may be either a quantum-dot light-emitting diode (QLED) or an organic light-emitting diode (OLED). If the light-emitting element ES is a QLED, the light-emitting layer to be used is a quantum-dot light-emitting layer containing quantum dots (QDs). If the light-emitting element ES is an OLED, the light-emitting layer to be used is an organic light-emitting layer made of an organic light-emitting material as a light-emitting material.

If the light-emitting element ES is a QLED, holes and electrons recombine together in the light-emitting layer by a current between the anode and the cathode, which forms an exciton. While the exciton transforms from the conduction band level to the valence band level of the quantum dots, light (fluorescence) is released. If the light-emitting element ES is an OLED, holes and electrons recombine together in the light-emitting layer by a current between the anode and the cathode, which forms an exciton. While the exciton transforms to the ground state, light is released. Note that the light-emitting element ES may be a light-emitting element other than the OLED and the QLED (such as an inorganic light-emitting diode).

Note that the functional layer 42 may be either a single layer of the light-emitting layer alone, or a multilayer including a functional layer other than the light-emitting layer. The functional layer 42 may include, other than the light-emitting layer, at least one of such layers as, for example, a hole-injection layer (an HIL), a hole-transport layer (an HTL), an electron-transport layer (an ETL), or an electron-injection layer (an EIL).

If the light-emitting element ES is a QLED, each of the HIL, the HTL, the ETL, and the EIL is formed of either an organic material or an inorganic material. If the light-emitting element ES is an OLED, each of the HIL, the HTL, the ETL, and the EIL is formed of an organic material.

The HIL and the HTL can be made of a known hole-transporting material. The HIL and the HTL can be made of, for example, nickel oxide (NiO), copper aluminate ($CuAlO_2$), poly(3,4-ethylenedioxythiophene)-poly(4-styrene sulfonate) (PEDOT: PSS)), polyvinylcarbazole (PVK), or poly[(9,9-dioctylfluorenyl-2,7-diyl)-co-(4,4'-(N-(4-sec-butylphenyl)diphenylamine)].

The ETL and the EIL can be made of a known electron-transporting material. The ETL and the EIL can be made of, for example, zinc oxide (ZnO), zinc magnesium oxide (ZnMgO), 1,3,5-tris(1-phenyl-1H-benzimidazol-2-yl)benzene (TPBi), and bathophenanthroline (Bphen).

Figure 3:
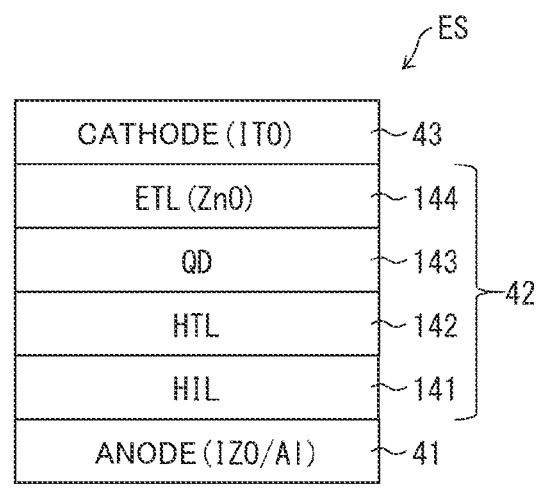
FIG. 3 is a diagram schematically illustrating an exemplary multilayer structure of a light-emitting element illustrated in FIG. 2.
Figure 4:
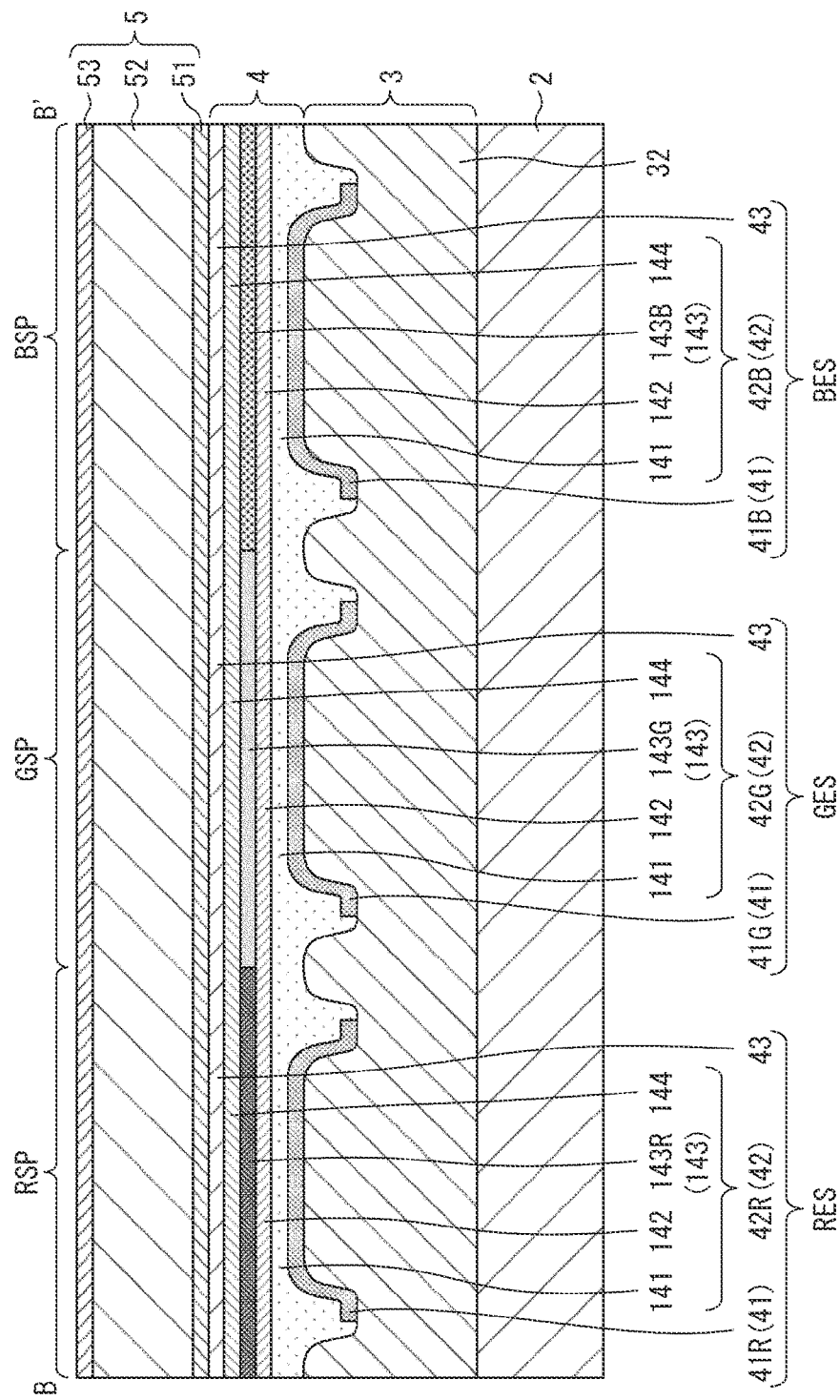
FIG. 4 is a cross-sectional view of the pixel, viewed along arrows B-B' in FIG. 1, when the light-emitting element has the multilayer structure illustrated in FIG. 3.

FIG. 3 is a diagram schematically illustrating an exemplary multilayer structure of the light-emitting element ES illustrated in FIG. 2. FIG. 4 is a cross-sectional view of the pixel P, viewed along arrows B-B' in FIG. 1, when the light-emitting element ES has the multilayer structure illustrated in FIG. 3.

FIGS. 3 and 4 show, as an example, a case where the lower electrode 41 is an anode (a patterned anode), and the upper electrode 43 is a cathode (a common cathode). Moreover, FIGS. 3 and 4 show, as an example, a case where the functional layer 42 includes an HIL 141, an HTL 142, a light-emitting layer 143, and an ETL 144 stacked on top of another in the stated order from below.

Note that, of the lower electrode 41 and the upper electrode 43, an electrode to release light needs to be transparent to light. Meanwhile, an electrode across from the light-releasing electrode may be either transparent or non-transparent to light.

FIG. 3 shows an exemplary case where the display device 1 is a top-emission display device in a known structure. In such a case, the lower electrode 41 is formed of a light-reflective electrode. The upper electrode 43 is formed of a light-transparent electrode that is transparent to light, such as a transparent electrode or a translucent electrode. Each of the lower electrode 41 and the upper electrode 43 is either a single layer or a multilayer. As described above, if the display device 1 is a top-emission display device, the lower electrode 41 may have a multilayer structure including a light-reflective electrode and a light-transparent electrode.

The transparent electrode is formed of, for example, indium tin oxide (ITO) or indium zinc oxide (IZO). The translucent electrode is formed of, for example, a light-transparent metal thin film made of, for example, an alloy of magnesium and silver. The light-reflective electrode is formed of, for example, such a metal as silver (Ag) or aluminum (Al). Alternatively, the light-reflective electrode is formed of an alloy containing those metals.

FIG. 3 shows an exemplary case where the lower electrode 41 is an anode having a multilayer structure of Al and IZO, the upper electrode 43 is a cathode made of ITO, the light-emitting layer 143 is a quantum dot (QD) layer, and the ETL 144 is a ZnO layer.

The trench 143 illustrated in FIG. 4 is shaped into an island for each of the sub-pixels SP. At least one layer, included in the functional layer 42 and other than the light-emitting layer 143, may be shaped into an island for each of the sub-pixels SP, or formed monolithically in common among all the sub-pixels SP. FIG. 4 shows an exemplary case where the functional layer 42 (specifically, the HIL 141, the HTL 142, and the ETL 144) other than the light-emitting layer 143 is a common layer provided in common among all the sub-pixels SP.

Hence, in the example illustrated in FIG. 4, a functional layer 42R in the light-emitting element RES includes from below the HIL 141 as a common layer, the HTL 142 as a common layer, a light-emitting layer 143R colored red and shaped into an island, and the ETL 144 as a common layer. Moreover, a functional layer 42G in the light-emitting element GES includes from below the HIL 141 as a common layer, the HTL 142 as a common layer, a light-emitting layer 143G colored green and shaped into an island, and the ETL 144 as a common layer. A functional layer 42B in the light-emitting element BES includes from below the HIL 141 as a common layer, the HTL 142 as a common layer, a light-emitting layer 143B colored blue and shaped into an island, and the ETL 144 as a common layer.

Hence, the light-emitting element RES includes from below a lower electrode 41R that is a pixel anode shaped into an island, the HIL 141, the HTL 142, the light-emitting layer 143R, the ETL 144, and the upper electrode 43 that is a common cathode. The light-emitting element GES includes from below a lower electrode 41G that is a pixel anode shaped into an island, the HIL 141, the HTL 142, the light-emitting layer 143G, the ETL 144, and the upper electrode 43 that is a common cathode. The light-emitting element BES includes from below a lower electrode 41B that is a pixel anode shaped into an island, the HIL 141, the HTL 142, the light-emitting layer 143B, the ETL 144, and the upper electrode 43 that is a common cathode.

As illustrated in FIGS. 1 and 2, the lower electrodes 41 in the light-emitting elements ES are patterned so that an edge portion (a pattern edge) of each of the lower electrodes 41 is positioned inside the trench 131 shaped into a frame and provided in the planarization film 32 below the lower electrode 41. In other words, in plan view, the trench 131 is provided along the edge portion of the lower electrode 41 in each light-emitting element ES, so that the edge portion (an edge of the lower electrode) of the lower electrode 41 is positioned inside the trench 131. Thus, as illustrated in FIG. 1, the trench 131 is similar in outline to the lower electrode 41, and formed slightly larger than the lower electrode 41. Note that FIG. 2 shows an exemplary case where the edge portion of the lower electrode 41 is positioned to a bottom center of the trench 131. However, it is essential only that the edge portion of the lower electrode 41 is positioned inside the trench 131. The edge portion does not necessarily have to be positioned to the bottom center of the trench 131.

As illustrated in FIG. 2, the trench 131 has a depth $d11$ desirably smaller than a depth of the contact hole portion 132 (i.e. a depth of the thin-film-transistor-light-emitting-element contact portion 33). This is because if the depth $d11$ of the trench 131 were, for example, as great as, or greater than, the depth of the contact hole portion 132, the lower electrode 41 inside the trench 131 and a wire inside the thin-film-transistor layer 3 might short-circuit. Note that the depth of the contact hole portion 132 is as great as a thickness of the planarization film 32. Hence, the depth $d11$ of the trench 131 is desirably smaller than the thickness of the planarization film 32.

Moreover, as illustrated in FIG. 2, the depth $d11$ of the trench 131 is desirably greater than a thickness of the functional layer 42 in each light-emitting element ES, except in the trench 131 and the contact hole portion 132.

For each light-emitting element ES, a thickness $d1$ of the functional layer 42 out of the trench 131 and the contact hole 132 is typically 200 nm or less. Moreover, a thickness of the planarization film 32 is typically 4 μm or less. Hence, it is desirable that the depth d11 of the trench 131 is specifically greater than 200 nm and smaller than 4 μm.

According to this embodiment, as illustrated in FIG. 2, the functional layer 42 is thick in the trench 131. Hence, the trench 131 is a non-light emitting region.

In this embodiment, a light-emitting region of each of the light-emitting elements ES is defined by a size of the lower electrode 41 in plan view and a thickness of the functional layer 42. Hence, in this embodiment, each trench 131 defines the light-emitting region of the light-emitting element ES in the respective sub-pixel SP. In this embodiment, FIG. 1 shows, by cross-hatching on the sub-pixel BSP, that the region surrounded with the trench 131 of the sub-pixel BSP is a light-emitting region of the light-emitting element BES. Note that, in FIG. 1, as an example, the sub-pixel BSP is cross-hatched. However, also for each of the sub-pixels RSP and GSP, similar to the sub-pixel B SP, the region surrounded with the trench 131 is a light-emitting region of the light-emitting element ES in the respective sub-pixel SP.

Moreover, according to this embodiment, as described above, the functional layer 42 is thick inside the trench 131. Hence, according to this embodiment, as described above, the edge portion of the lower electrode 41 is provided inside the trench 131. Hence, even if the edge portion of the lower electrode 41 is not provided with an edge cover, the lower electrode 41 and the upper electrode 43 can be kept from short circuit.

Note that, in this embodiment, a width d12 (a line width) of the trench 131 in plan view shall not be limited to a particular width as long as the lower electrode 41 can be patterned as the edge portion of the lower electrode 41 is positioned inside the trench 131. However, the greater the width d12 of the trench 131 becomes, the lower the aperture ratio (a light-emitting area in the light-emitting region) of the sub-pixel is. Hence, the width d12 of the trench 131 is desirably 15 μm or less. Note that, in this embodiment, the width d12 of the trench 131 in FIGS. 1 and 2 indicates a width of an upper end of the trench 131 in plan view.

The sealing layer 5 is a layer to prevent foreign objects such as water and oxygen from penetrating into the light-emitting-element layer 4. The sealing layer 5 includes, for example, an inorganic sealing film 51 covering the upper electrode 43, an organic buffer film 52 provided above the inorganic sealing film 51, and an inorganic sealing film 53 provided above the organic buffer film 52.

The inorganic sealing film 51 and the inorganic sealing film 53 are light-transparent inorganic insulating films. Each of the inorganic sealing film 51 and the inorganic sealing film 53 can be, for example, an inorganic insulating film such as a silicon oxide film or a silicon nitride film formed by the CVD. The organic buffer film 52 is a light-transparent organic insulating film having a planarizing effect. The organic buffer film 52 can be made of an applicable organic material such as acrylic. The organic buffer film 52 can be formed by, for example, ink-jet printing. A not-shown bank to block the ink droplets may be provided to the frame region NDA.

On the sealing layer 5, a not-shown functional film is provided. The functional film has at least one of, for example, an adaptive optics correction function, a touch sensor function, or a protection function.

(Method for Manufacturing the Display Device 1)

Next, a method for manufacturing the display device 1 is described.

Figure 6:
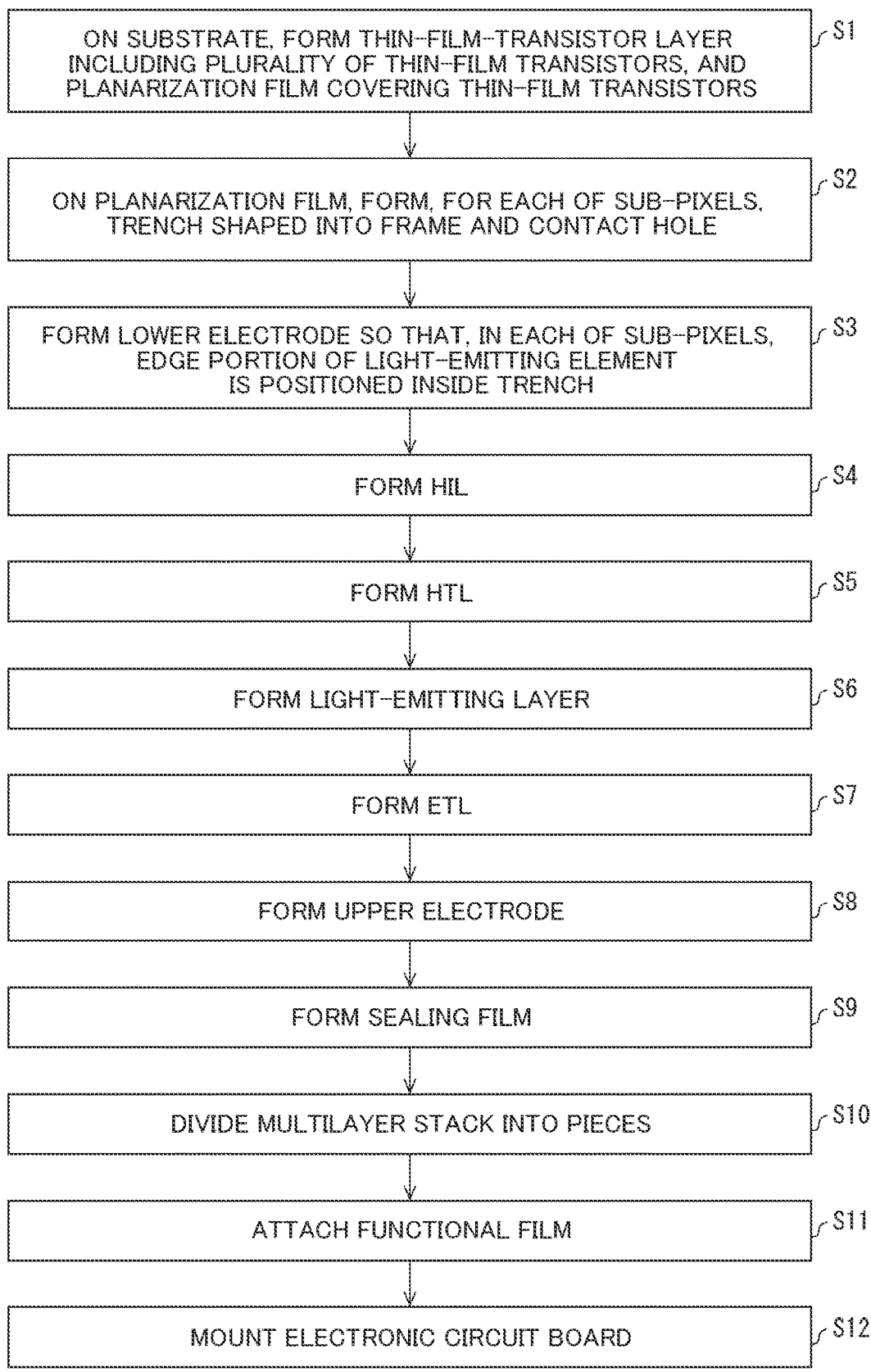
FIG. 6 is a flowchart sequentially showing manufacturing steps of the display device according to the first embodiment.

FIG. 6 is a flowchart sequentially showing manufacturing steps of the display device 1. Note that described below is an exemplary case where the light-emitting element ES has the multilayer structure illustrated in FIGS. 3 and 4.

As illustrated in FIG. 6, in the manufacturing steps of the display device 1 according this embodiment, first, on the substrate 2, the thin-film-transistor layer 3 is formed (Step S1). The thin-film-transistor layer 3 includes the plurality of thin-film transistors 31, and the planarization film 32 covering these thin-film transistors 31. Next, on the planarization film 32, the trench 131 shaped into a frame and the contact hole portion 132 are formed for each of the sub-pixels SP (Step S2).

Note that the planarization film 32 can be formed by such a coating technique as, for example, spin-coating. Moreover, the trench 131 and the contact hole portion 132 can be formed by such a technique as, for example, photolithography. Note that, as described before, the depth d11 of the trench 131 is desirably smaller than the depth of the contact hole 132. Hence, the trench 131 is half-etched so that the trench 131 is smaller in etching depth from an upper portion of the planarization film 32 than the contact hole portion 132.

Next, the lower electrode 41 is formed so that, in each of the sub-pixels SP, the edge portion of the light-emitting element ES is positioned inside the trench 131 (Step S3). Next, on the lower electrode 41, the HIL 141 is formed (Step S4). Next, on the HIL 141, the HTL 142 is formed (Step S5). Next, on the HTL 142, the light-emitting layer 143 is formed (Step S6). Next, on the light-emitting layer 143, the ETL 144 is formed (Step S7). Next, on the ETL 144, the upper electrode 43 is formed (Step S8). Hence, on the planarization film 32, the light-emitting-element layer 4 including the plurality of light-emitting elements ES is formed.

Note that the lower electrode 41 and the upper electrode 43 can be formed by various kinds of known techniques to form anodes and cathodes. Such techniques include, for example, sputtering, vacuum deposition, the CVD, the plasma CVD, and printing.

Moreover, the technique to form the light-emitting layer 143 shall not be limited to a particular technique as long as the technique can form fine patterns to be required for the light-emitting elements ES. Examples of the techniques to form the light-emitting layer 143 can include vapor deposition, printing, ink-jet printing, spin coating, casting, dipping, bar coating, blade coating, roll coating, gravure coating, flexographic printing, spray coating, photolithography, or self-assembly (layer-by-layer and self-assembled monolayer). Moreover, examples of the vapor deposition include vacuum deposition, spattering, and ion plating. Specific examples of the vacuum deposition include resistance heating vapor deposition, flash deposition, arc deposition, laser deposition, high-frequency heating deposition, and electron beam evaporation.

Note that if the light-emitting layer 143 is formed by such a technique as spin coating or ink-jet printing; that is, by application of a coating liquid containing a light-emitting material, the solvent of the coating liquid shall not be limited to a particular solvent as long as each of the materials of the light-emitting layer 143 can dissolve or disperse in the solvent.

The light-emitting layer 143 is shaped into an island for each of the sub-pixels SP as illustrated in FIG. 4, by the various kinds of techniques described above.

Moreover, the HIL 141, the HTL 142, and the ETL 144 can be formed by known various kinds of techniques to form a functional layer. Examples of the techniques include vapor deposition, printing, ink-jet printing, spin coating, casting, dipping, bar coating, blade coating, roll coating, gravure coating, flexographic printing, spray coating, photolithography, or self-assembly (layer-by-layer and self-assembled monolayer).

Next, on the upper electrode 43, the sealing layer 5 is formed to cover the light-emitting-element layer 4 (Step S9). As described before, the inorganic sealing films 51 and 53 can be formed by, for example, the CVD. Moreover, the organic buffer film 52 can be formed by such a coating technique as, for example, ink-jet printing.

Next, a multilayer stack including the substrate 2, the thin-film-transistor layer 3, the light-emitting-element layer 4, and the sealing layer 5 is divided into a plurality of pieces (Step S10). Next, to each of the obtained pieces, a not-shown functional film is attached (Step S11). Next, on a portion (the terminal unit TS) of the frame region NDA outside the display region DA in which the plurality of sub-pixels SP are formed, a not-shown electronic circuit board (e.g. an IC chip and an FPC) is mounted (Step S12). This is how the display device 1 according to this embodiment is manufactured. Note that Steps S1 to S12 are carried out on a display device manufacturing apparatus (including a deposition apparatus carrying out each of Steps S1 to S9).

Moreover, if a flexible display device is manufactured as the display device 1, prior to Step S1, a step of forming a resin layer on a light-transparent support substrate (e.g. a mother glass) and a step of forming a barrier layer on the resin layer may further be included. In such a case, at Step S1, the thin-film-transistor layer 3 is formed on the barrier layer. Moreover, at Step S9, the sealing layer 5 is formed. After that, on the sealing layer 5, an upper-face film is attached. After that, the support substrate is removed from the resin layer with, for example, a laser beam emitted on the support substrate, and a lower-face film is attached to a lower face of the resin layer. After that, at Step S10, a multilayer stack including the lower-face film, the resin layer, the barrier layer, the thin-film-transistor layer 3, the light-emitting-element layer 4, the sealing layer 5, and the upper-face film is divided into a plurality of pieces.

Advantageous Effects

Next, advantageous effects of the display device 1 according to this embodiment will be described in more detail. From now on, in order to describe the advantageous effects of the display device 1 according to this embodiment, first, a schematic configuration and a problem of a known display device are specifically described, with reference to FIGS. 7 and 8. Note that, for the sake of description, like reference signs designate identical or corresponding constituent features in FIGS. 1 to 5. These constituent features will not be elaborated upon.

Figure 7:
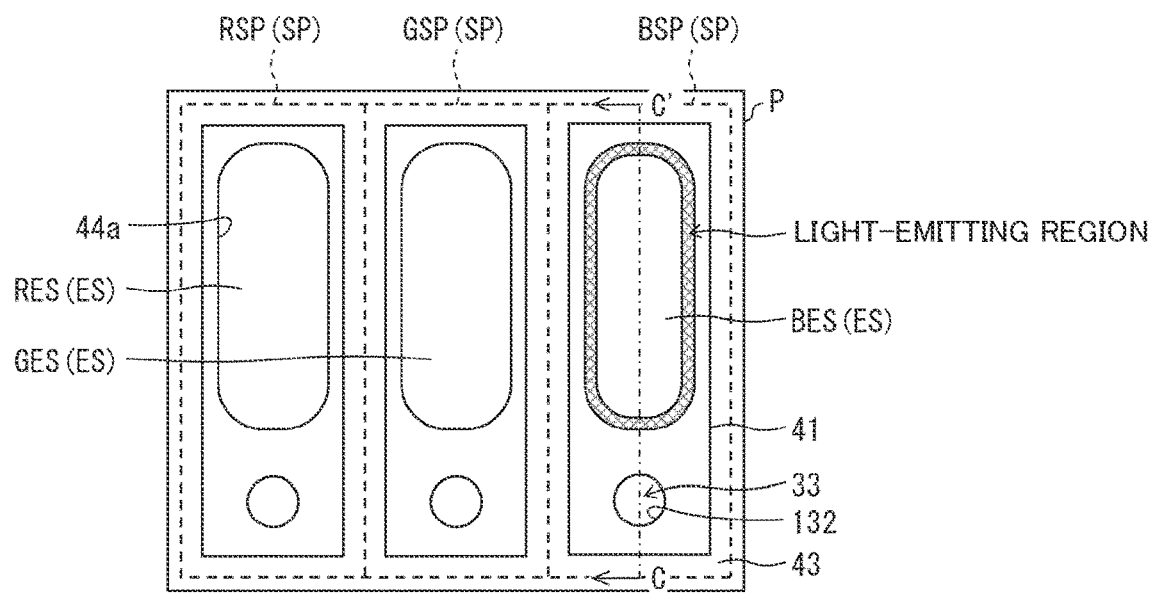
FIG. 7 is a plan view of an exemplary schematic configuration of a pixel in a known display device.
Figure 8:
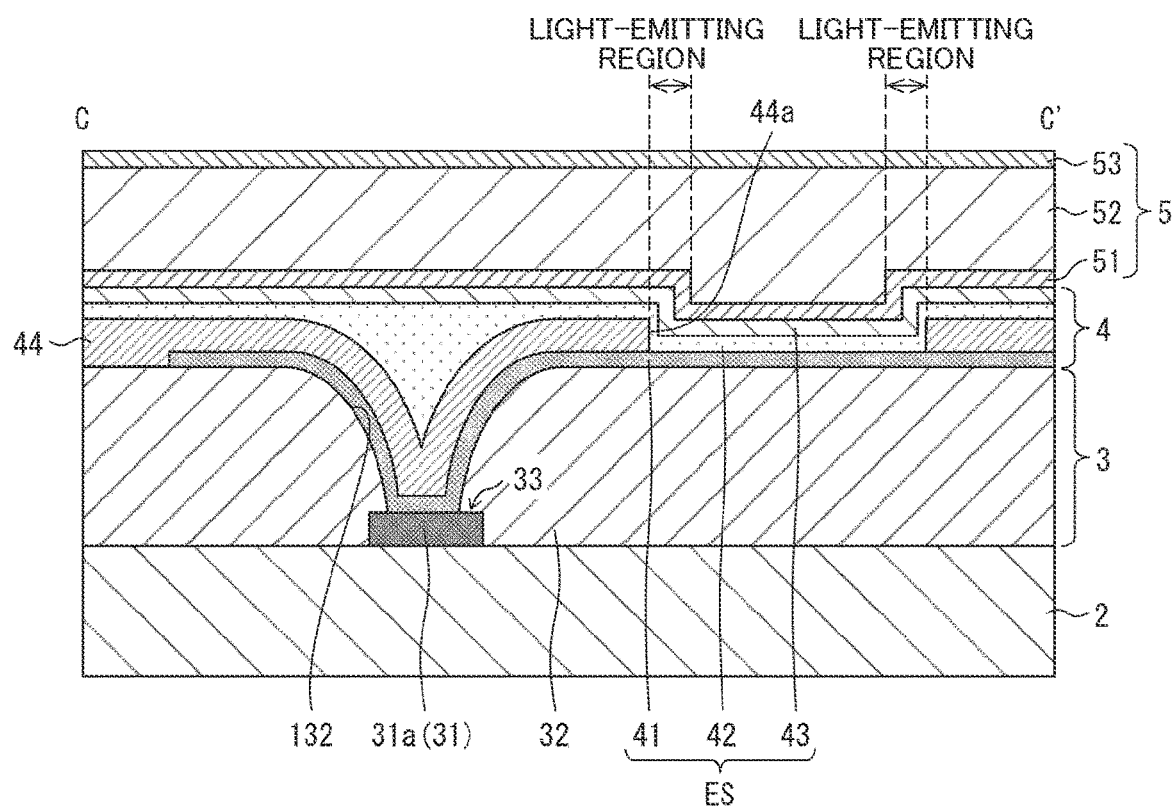
FIG. 8 is a cross-sectional view of a sub-pixel, viewed along arrows C-C' in FIG. 7.

FIG. 7 is a plan view (a perspective view) of an exemplary schematic configuration of a pixel P in a known display device. FIG. 8 is a cross-sectional view of a sub-pixel SP, viewed along arrows C-C' in FIG. 7.

As illustrated in FIG. 7, in order to prevent a short circuit between the lower electrode 41 and the upper electrode 43 in the known display device, an edge of the lower electrode 41 is covered with an insulating layer 44 referred to as a bank or an edge cover and shaped into, for example, a grid. Moreover, an opening portion 44a of the insulating layer 44 is coated with a light-emitting material. Hence, an interior of the opening portion 44a in this insulating layer 44 is an original light-emitting region of the light-emitting element ES.

However, when the light-emitting material is applied to the interior of the opening portion 44a in the insulating layer 44, the applied light-emitting material dries. After that, the light-emitting material agglomerates on an edge portion (an edge of the opening portion and a rim portion) of the opening portion 44a. Such a phenomenon is referred to as the coffee ring phenomenon.

An evaporating speed of a solvent in a coating liquid containing the light-emitting material is faster than an evaporating speed of the solvent in a center portion on an upper face surrounded with the edge portion of the opening portion 44a in the insulating layer 44. Hence, while the solvent is evaporating, a dissolved substance; that is, the light-emitting material on the upper face, moves from the center portion to the edge portion. Hence, the light-emitting material agglomerates on the edge portion of the opening portion 44a.

Thus, as cross-hatched in FIG. 7 and boxed in FIG. 8, a light-emitting region to actually emit light is almost only the edge portion inside the opening portion 44a of the insulating layer 44, and the other region inside the opening portion 44a rarely emits light. Hence, the light-emitting region of the known display device is substantially ring-shaped. As a result, the display screen of the known display device has a problem; that is, the display screen is very dark.

Moreover, in the known display device, the functional layer 42 is thin above the insulating layer 44. Hence, if the insulating layer 44 suffers from poor insulation, a leak might occur between the lower electrode 41 and the upper electrode 43.

However, according to this embodiment, the planarization film 32 is provided with the trench 131 as illustrated in FIGS. 1 and 2 such that the functional layer 42 directly above the trench 131 can be formed thicker. Hence, according to this embodiment, even if an edge cover such as the insulating layer 44 is not formed, the lower electrode 41 and the upper electrode 43 can be kept from a short circuit. Moreover, according to this embodiment, unlike the case where an edge cover such as the insulating layer 44 is provided, a problem of leak due to poor insulation of the edge cover does not occur between the lower electrode 41 and the upper electrode 43.

Furthermore, because no edge cover such as the insulating layer 44 is provided, the light-emitting material does not agglomerate on the edge of the opening portion of the edge cover. Hence, the light emits uniformly.

Note that, for each light-emitting element ES, a thickness d2 (see FIG. 2) of the functional layer 42 in the contact hole 132 is typically in a range of 2 µm or more and 4 µm or less. Hence, as can be seen in the trench 131, the functional layer 42 is thick in the contact hole portion 132. Thus, the light is not emitted. However, the contact hole portion 132 is small, and even if the contact hole 132 does not emit light, it will not be a problem because the human eye sees the light as if the light were uniformly emitted.

Moreover, according to the known structure, as illustrated in FIGS. 7 and 8, the insulating layer 44 is provided on the contact hole portion 132. The light-emitting region is provided to a portion with no contact hole portion 132. However, according to this embodiment, as illustrated in FIGS. 1 and 2, the light-emitting region can be formed to surround the contact hole portion 132. As can be seen, the light-emitting region can be formed significantly larger in area when the trench 131 is provided to the planarization film 32 than when the opening portion is provided to the edge cover. Hence, the aperture ratio (i.e. the light-emitting area in the light-emitting region) of this embodiment can be increased drastically higher than a known aperture ratio.

Then, according to this embodiment, as described above, the planarization film 32 is provided with the trench 131, and, in the recess of the trench 131, an end of the lower electrode 41 is disposed. Hence, the functional layer 42 directly above the end portion of the lower electrode 41 can be made significantly thick. Thus, according to this embodiment, the end portion of the lower electrode 41 can be successfully coated without reducing the aperture ratio.

Hence, this embodiment can provide the display device 1 capable of preventing a short circuit between the lower electrode 41 and the upper electrode 43, and emitting substantially uniform light in the light-emitting region. The display device 1 is higher in aperture ratio and luminance than a known display device.

Moreover, as described before, the functional layer 42 is thick inside the trench 131. Hence, the trench 131 is a non-light emitting region. Furthermore, where no lower electrode 41 is provided, the light-emitting layer 143 does not emit light. Hence, according to this embodiment, when the light-emitting layer 143 is patterned, even if the light-emitting layer 143 is slightly embedded in a neighboring sub-pixel SP and patterned, the light-emitting layer 143 embedded in the neighboring sub-pixel SP does not emit light. Hence, this embodiment can provide the display device 1 that can prevent color mixture.

(Modification 1)

Figure 9:
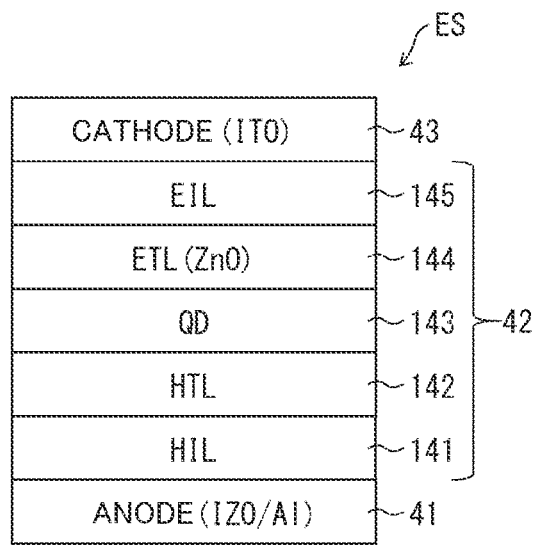
FIG. 9 is a diagram schematically illustrating another exemplary multilayer structure of the light-emitting element according to the first embodiment.

FIG. 9 is a diagram schematically illustrating another exemplary multilayer structure of the light-emitting element ES according to this embodiment.

As illustrated in FIG. 9, in the light-emitting element ES, the functional layer 42 may include the HIL 141, the HTL 142, the light-emitting layer 143, the ETL 144, and the EIL 145 stacked in the stated order from below. As described before, at least one layer, included in the functional layer 42 and other than the light-emitting layer 143, may be shaped into an island for each of the sub-pixels SP, or formed monolithically in common among all the sub-pixels SP. Hence, the EIL 145 may also be shaped into an island for each of the sub-pixels SP. Alternatively, similar to the HIL 141, the HTL 142, and the ETL 144 illustrated in FIG. 4, the EIL 145 may be monolithically formed in common among all the sub-pixels SP.

Note that, if the functional layer 42 includes the EIL 145, the ETL 144 is formed on the light-emitting layer 143 at Step S7. After that, another step is further included to form the EIL 145 on the ETL 144. In such a case, at Step S8, the upper electrode 43 is formed on the EIL 145.

(Modification 2)

Figure 10:
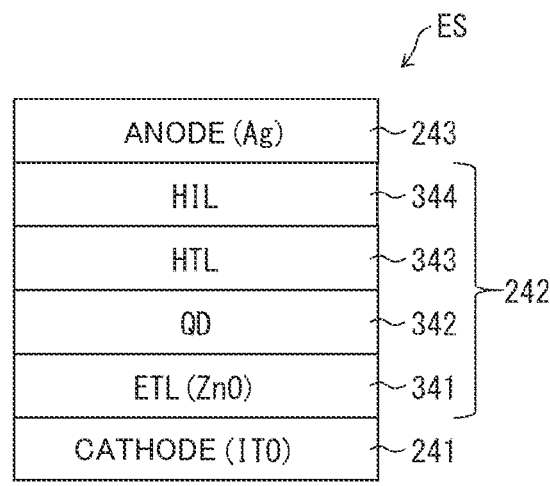
FIG. 10 is a diagram schematically illustrating still another exemplary multilayer structure of the light-emitting element according to the first embodiment.

FIG. 10 is a diagram schematically illustrating still another exemplary multilayer structure of the light-emitting element ES according to this embodiment.

The light-emitting element ES illustrated in FIG. 10 may include, as an example, a lower electrode 241 as a cathode, an upper electrode 243 as an anode, and a functional layer 242 including an ETL 341, a light-emitting layer 342, an HTL 343, and an HIL 344 stacked in the stated order from below. Note that, as a matter of course, the functional layer 242 illustrated in FIG. 10 may further include an EIL between the lower electrode 241 and the ETL 341.

Moreover, FIG. 10 exemplifies a case where the lower electrode 241 is made of ITO, and the upper electrode 243 is made of Ag. Note that, FIG. 10 also exemplifies a case where the light-emitting layer 342 is a quantum dot (QD) layer and the ETL 341 is a ZnO layer. However, this embodiment shall not be limited to such a case.

As illustrated in FIG. 10, the light-emitting element ES may be a bottom-emission light-emitting element having an inverted structure. As a light-emitting element ES, instead of the light-emitting element ES illustrated in FIG. 3 or FIG. 9, a light-emitting element ES illustrated in FIG. 10 may be used so that the display device 1 can be a bottom-emission one having an inverted structure.

SECOND EMBODIMENT

Another embodiment of the present disclosure is described below, with reference to FIG. 11. Note that this embodiment describes differences from the first embodiment. For the sake of description, like reference signs designate identical or corresponding constituent features between this embodiment and the first embodiment. These constituent features will not be elaborated upon.

Figure 11:
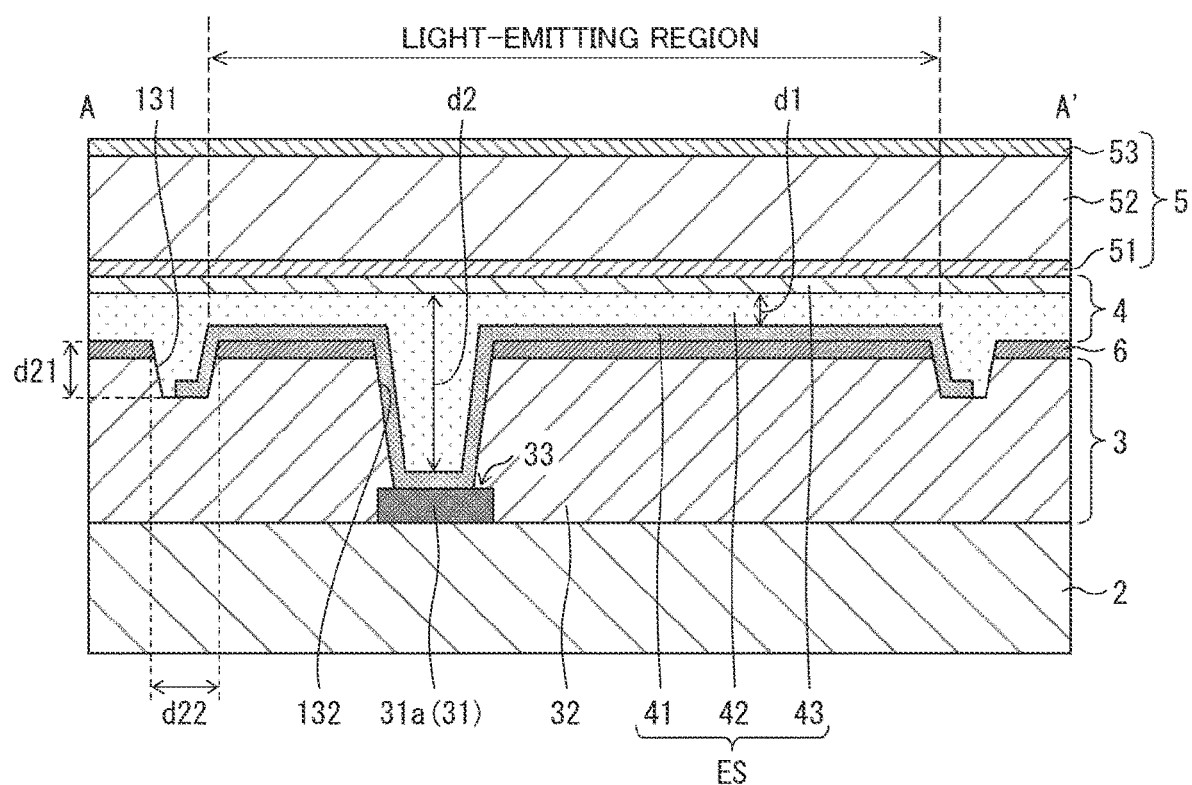
FIG. 11 is a cross-sectional view of a schematic configuration of a sub-pixel in the display device according to a second embodiment.

FIG. 11 is a cross-sectional view illustrating a schematic configuration of a sub-pixel SP in the display device 1 according to this embodiment. Note that a plan view (a perspective view) of an exemplary schematic configuration of a pixel P in the display device 1 according to this embodiment is the same as the plan view in FIG. 1. Hence, this embodiment omits the plan view of the exemplary schematic configuration of the pixel P in the display device 1 according to this embodiment. FIG. 11 corresponds to the cross-sectional view of the sub-pixel SP, viewed along the arrows A-A' in FIG. 1.

The display device 1 according to this embodiment is the same as the display device 1 according to the first embodiment except the points below. The display device 1 according to this embodiment includes an inorganic insulating film 6 on, and adjacent to, the planarization film 32. Hence, in this embodiment, the lower electrode 41 is provided on the inorganic insulating film 6.

Note that the inorganic insulating film 6 is provided only on an upper face of the planarization film 32, and not inside the trench 131 or the contact hole portion 132.

That is, in this embodiment, as also seen at Step S1 in the first embodiment, the thin-film-transistor layer 3 is formed on the substrate 2. The thin-film-transistor layer 3 includes the plurality of thin-film transistors 31, and the planarization film 32 covering these thin-film transistors 31. After that, in this embodiment, before the trench 131 and the contact hole portion 132 are formed at Step S2, the inorganic insulating film 6 is formed on, and in adjacent to, the planarization film 32. Hence, at Step S2, the trench 131 and the contact hole portion 132 are formed from the inorganic 6 to the planarization film 32.

Furthermore, in this embodiment, the trench 131 desirably has a depth d21 set in the same manner as the depth 11 of the trench 131 of the display device 1 according to the first embodiment. Likewise, of the display device 1 according to this embodiment, the trench 131 desirably has a width d22 (a line width) set in the same manner as the width d12 (the line width, see FIG. 2) in plan view of the trench 131 of the display device 1 according to the first embodiment.

The inorganic insulating film 6 can be formed of, for example, silicon oxide or silicon nitride.

The thickness of the inorganic insulating film 6 shall not be limited to a particular thickness. However, in order to avoid an excessive sum of the thicknesses of the inorganic insulating film 6 and the planarization film 32, and the resulting problem for forming the contact hole, the inorganic insulating film 6 desirably has a thickness of 400 nm or less.

The trench formed when the inorganic layer is etched has a taper (an inclination) shaped sharper than a taper of a trench formed when an organic layer is etched. Thus, in this embodiment, as described above, the inorganic insulating film 6 is provided on, and adjacent to, the planarization film 32. Hence, as illustrated in FIG. 11, the trench 131 in the planarization film 32 can be kept from having a significantly gentle taper. As a result, this embodiment can provide an aperture ratio higher than the aperture ratio provided in the first embodiment.

The present disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the present disclosure. Moreover, the technical aspects disclosed in each embodiment may be combined to achieve a new technical feature.

The invention claimed is:

1. A display device including a plurality of sub-pixels, the display device comprising:
 a support body;
 a thin-film-transistor layer;
 a light-emitting-element layer; and
 a sealing layer sealing the light-emitting element, the support body, the thin-film-transistor layer, the light-emitting-element layer, and the sealing layer provided in this stated order, wherein:
 the thin-film-transistor layer includes:
  a plurality of thin-film transistors, and
  a planarization film covering the plurality of thin-film transistors,
 the light-emitting-element layer includes a plurality of light-emitting elements configured to emit lights in different colors,
 each of the plurality of light-emitting elements includes:
  a lower electrode,
  an upper electrode, and
  a functional layer including a light-emitting layer, the functional layer being formed between the lower electrode and the upper electrode,
 the lower electrode is a sub-pixel electrode shaped into an island and provided for each of the sup-pixel electrodes,
 the upper electrode is a common electrode formed in common among all sub-pixels in the plurality of sub-pixels,
 the planarization film includes a trench shaped into a frame and provided for each of the plurality of sub-pixels, the trench defining a light-emitting region of the light-emitting element for each of the plurality of sub-pixels,
 an entire edge portion of the lower electrode in each of the light-emitting elements is formed inside the trench,
 a contact hole portion is provided in a region surrounded by the trench for each of the plurality of sub-pixels, the contact hole portion electrically connecting, for each of the plurality of sub-pixels, the lower electrode of the light-emitting element to the thin-film transistors, and
 the edge portion of the lower electrode and the functional layer are directly in contact with each other.

2. The display device according to claim 1, wherein the trench has a depth smaller than a depth of the contact hole portion.

3. The display device according to claim 2, wherein the depth of the trench is greater than a thickness of the functional layer out of the trench and the contact hole portion.

4. The display device according to claim 1, wherein the lower electrode is an anode.

5. The display device according to claim 1, wherein the lower electrode is a cathode.

6. The display device according to claim 1, wherein the functional layer includes, in addition to the light-emitting layer, at least one of a hole-injection layer, a hole-transport layer, an electron-transport layer, or an electron-injection layer.

7. The display device according to claim 6, wherein the at least one of the hole-injection layer, the hole-transport layer, the electron-transport layer, or the electron-injection layer, included in the functional layer in addition to the light-emitting layer, is provided in common among the plurality of the plurality of sub-pixels.

8. The display device according to claim 1, further comprising an inorganic insulating film provided between the planarization film and the upper electrode.

9. The display device according to claim 1, wherein the light-emitting layer is a quantum-dot light-emitting layer containing quantum dots.

10. The display device according to claim 1, wherein, for each of the plurality of sub-pixels, a thickness of the functional layer overlapping the trench is greater than a thickness of the functional layer out of the trench and the contact hole portion.

11. A display device including a plurality of sub-pixels, the display device comprising:
 a support body;
 a thin-film-transistor layer;
 a light-emitting-element layer;
 an inorganic insulating film; and
 a sealing layer sealing the light-emitting element, the support body, the thin-film-transistor layer, the light-emitting-element layer, and the sealing layer provided in a this stated order, wherein:
 the thin-film-transistor layer includes:
  a plurality of thin-film transistors, and
  a planarization film covering the plurality of thin-film transistors,
 the light-emitting-element layer includes a plurality of light-emitting elements configured to emit lights in different colors,
 each of the plurality of light-emitting elements includes:
  a lower electrode,
  an upper electrode, and
  a functional layer including a light-emitting layer, the functional layer being formed between the lower electrode and the upper electrode,
 the lower electrode is a sub-pixel electrode shaped into an island and provided for each of the sup-pixel electrodes,
 the upper electrode is a common electrode formed in common among all sub-pixels in the plurality of sub-pixels,
 the planarization film includes a trench shaped into a frame and provided for each of the plurality of sub-pixels, the trench defining a light-emitting region of the light-emitting element for each of the plurality of sub-pixels, an entire edge portion of the lower electrode in each of the light-emitting elements is formed inside the trench, a contact hole portion is provided in a region surrounded by the trench for each of the plurality of sub-pixels, the contact hole portion electrically connecting, for each of the plurality of sub-pixels, the lower electrode of the light-emitting element to the thin-film transistors, the inorganic insulating film is provided between the planarization film and the upper electrode, and for each of the plurality of sub-pixels, the inorganic insulating film is not provided inside the trench or the contact hole portion.

* * * * *